(12) United States Patent
Wich et al.

(10) Patent No.: US 8,274,314 B2
(45) Date of Patent: Sep. 25, 2012

(54) ERROR AMPLIFIER FOR REGULATING SINGLE FEEDBACK INPUT AT MULTIPLE LEVELS

(75) Inventors: Mathew Todd Wich, Colorado Springs, CO (US); Albert MienYee Wu, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 226 days.

(21) Appl. No.: 12/752,858

(22) Filed: Apr. 1, 2010

(65) Prior Publication Data

US 2011/0241772 A1 Oct. 6, 2011

(51) Int. Cl.
*H03K 5/22* (2006.01)
(52) U.S. Cl. .......................................................... 327/63
(58) Field of Classification Search ...................... 327/63; 323/282
See application file for complete search history.

(56) References Cited

U.S. PATENT DOCUMENTS 7,579,816 B2   8/2009   Wu
2007/0183173 A1* 8/2007   Wu ................................ 363/72

OTHER PUBLICATIONS

Linear Technology Corporation. 2000. LT1931/LT1931A: 1.2 MHz/2.2MHz Inverting DC/DC Converters in Thin SOT. Product Data Sheet. Linear Technology Corporation, Milpitas, CA, 12 pages.
Linear Technology Corporation. 2001. LT1946: 1.2 MHz Boost DC/DC Converter with 1.5A Switch and Soft-Start. Product Data Sheet. Linear Technology Corporation, Milpitas, CA, 12 pages.

* cited by examiner

*Primary Examiner* — Lincoln Donovan
*Assistant Examiner* — Daniel Rojas
(74) *Attorney, Agent, or Firm* — McDermott Will & Emery LLP

(57) ABSTRACT

An error amplifier may be part of a voltage regulator and may include a single feedback input configured to receive a feedback signal. A single error output may be configured to provide an error output signal indicative of error in the feedback signal. A comparison circuit may be configured to provide an error signal to the single error output which is indicative of a difference between the feedback signal and whichever one of a set of reference signals is closest to the feedback signal. One or more of these reference signals may each be derived from an offset from a ground reference. One or more of the other reference signals may each be derived from an offset from a non-ground reference, such as a source of power for the error amplifier. The error amplifier may be on a single integrated circuit along with an associated driver circuit.

20 Claims, 12 Drawing Sheets

ERROR AMPLIFIER FOR REGULATING SINGLE FEEDBACK INPUT AT MULTIPLE LEVELS

BACKGROUND

1. Technical Field

This disclosure relates to voltage regulators, including error amplifiers used in them.

2. Description of Related Art

A voltage regulator may convert an input voltage to a regulated output voltage.

The voltage regulator may include an error amplifier. The error amplifier may compare a feedback signal, which may be proportional to the output voltage of the voltage regulator, with a reference voltage. The results of the comparison may be used to regulate the output voltage.

FIG. 1 is an example of a prior art voltage regulator which provides a positive output voltage based on a positive input voltage and which uses a combined error amplifier and driver circuit on a single integrated circuit. The LT1946 made by Linear Technology Corporation is an example of such an integrated circuit.

A driver circuit within the integrated circuit may deliver an output switching signal (SW) which may be used in the voltage regulator to effectuate output voltage regulation. The switching signal SW may be based in part on a comparison of the feedback signal FB with an internal reference voltage $V_{REF}$ by an error amplifier within the integrated circuit. The feedback signal FB may be generated by a resistor divider network R1 and R2 between the output voltage $V_{OUT}$ and ground.

FIG. 2 is an example of a prior art comparison circuit which may be used in the error amplifier illustrated in FIG. 1. As illustrated in FIG. 2, the reference voltage $V_{REF}$ may be generated internal to the integrated circuit. Differences between the reference voltage $V_{REF}$ and the feedback signal FB may be measured by amplifier A1 and may tell the error amplifier whether the output voltage $V_{OUT}$ is too high, too low, or just right, as indicated by the error output VC of the amplifier A1. The driver circuit within the integrated circuit in FIG. 1 may respond to this information by adjusting the timing of the switching signal SW, causing the output voltage $V_{OUT}$ to converge to the correct amount.

The configuration illustrated in FIG. 2 may be useful when the regulated output voltage $V_{OUT}$ is positive with respect to the ground GND of the combined error amplifier and driver circuit. However, when the output voltage $V_{OUT}$ is negative with respect to the ground GND of the combined error amplifier and driver circuit, this configuration may be problematic and a different configuration may be needed.

FIG. 3 is an example of a prior art voltage regulator which provides a negative output voltage based on a positive input voltage and which uses a combined error amplifier and driver circuit on a single integrated circuit. The LT1931 manufactured by Linear Technology Corporation is an example of such an integrated circuit.

FIG. 4 is an example of a prior art comparison circuit which may be used in the combined error amplifier and driver circuit illustrated in FIG. 3. As illustrated in FIG. 4, a different configuration for the comparison circuit may be needed because the output voltage is negative with respect to ground.

FIG. 5A is an example of a prior art comparison circuit which may be used in an error amplifier in a voltage regulator which may provide either a positive or negative output based on a positive input. FIG. 5A illustrates a three pin sensing configuration. FIG. 5B illustrates the circuit configured to sense positive output voltage. FIG. 5C illustrates the circuit configured to sense negative output voltage. Thus, the same comparison circuit in FIG. 5A may be configured to sense both positive and negative output voltages, while the comparison circuits illustrated in FIGS. 2 and 4 may only be able to sense output voltages having only one of these polarities.

This increase in flexibility, however, may come at the expense of requiring two additional signal pins. When the error amplifier is contained on a single integrated circuit, this may add to the number of pins which must be dedicated to receiving the feedback signal.

FIG. 6A is another example of a prior art comparison circuit which may be used in an error amplifier in a voltage regulator which may provide either a positive or negative output based on a positive input. This configuration is described in more detail in U.S. Pat. No. 7,579,816, the entire contents of which is incorporated herein by reference. As described in more detail in this patent, FIG. 6A illustrates a two-pin sensing configuration. FIG. 6B illustrates this circuit configured to sense positive output voltages. FIG. 6C illustrates this circuit configured to sense negative output voltages. The configuration illustrated in FIGS. 6A-6C may provide similar flexibility to the configuration illustrated in FIGS. 5A-5C, but may require using only two signal pins, instead of three. U.S. Pat. No. 7,579,816 also describes a further configuration which also senses both positive and negative output voltages in a voltage regulator, but which requires only a single feedback pin.

All of the configurations which have been described, however, sense output voltage $V_{OUT}$ with respect to the ground pin (GND) on the combined error amplifier and driver circuit (when contained within an integrated circuit). However, there may be a need to generate output voltages which are regulated with respect to the power supply input pin $V_{IN}$ of the integrated circuit, rather than with respect to the ground (GND) of the integrated circuit.

FIG. 7 is an example of a prior art voltage regulator which provides a negative output voltage based on a negative input voltage and which uses a combined error amplifier and driver circuit on a single integrated circuit. FIG. 7 illustrates how an integrated circuit of the type having a sensing configuration similar to that illustrated in FIG. 2 may be adapted for regulating an output voltage which is negative with respect to the integrated circuit's input voltage $V_{IN}$ pin.

To facilitate this functionality, additional components, such as Q1, may be required to perform a level shifting function. In addition to costs, these additional components may introduce inaccuracies in the output voltage $V_{OUT}$. These inaccuracies may be caused, for example, by manufacturing and temperature variations in the emitter-to-base voltage drop of Q1 and/or variations in the current gain of Q1.

FIG. 8 is an example of a prior art voltage regulator which provides a positive output voltage based on a negative input voltage and which uses a combined error amplifier and driver circuit on a single integrated circuit. FIG. 8 illustrates an adaptation of the FIG. 2 sensing scheme which regulates an output voltage $V_{OUT}$ which is positive with respect to the integrated circuit's $V_{IN}$ pin. This adaptation may suffer from the same inaccuracies discussed above in connection with FIG. 7.

SUMMARY

An error amplifier may include a single feedback input configured to receive a feedback signal. A single error output may be configured to provide an error output signal indicative of error in the feedback signal. The error may be indicative of a difference between the feedback signal and whichever one of multiple different reference signals is closest to the feedback signal.

The multiple different reference signals may include four different reference signals. One may be positively offset from the ground of the error amplifier, another may be negatively offset from the ground, another may be positively offset from a non-ground reference for the error amplifier, and another may be negatively offset from the non-ground reference. The non-ground reference may be the same as the power which powers the error amplifier.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details which may be apparent or unnecessary may be omitted to save space or for more effective illustration. Conversely, some embodiments may be practiced without all of the details which are disclosed. When the same numeral appears in different drawings, it refers to the same or like components or steps.

DETAILED DESCRIPTION OF ILLUSTRATIVE EMBODIMENTS

Illustrative embodiments are now discussed. Other embodiments may be used in addition or instead. Details which may be apparent or unnecessary may be omitted to save space or for a more effective presentation. Conversely, some embodiments may be practiced without all of the details which are disclosed.

Figure 9:
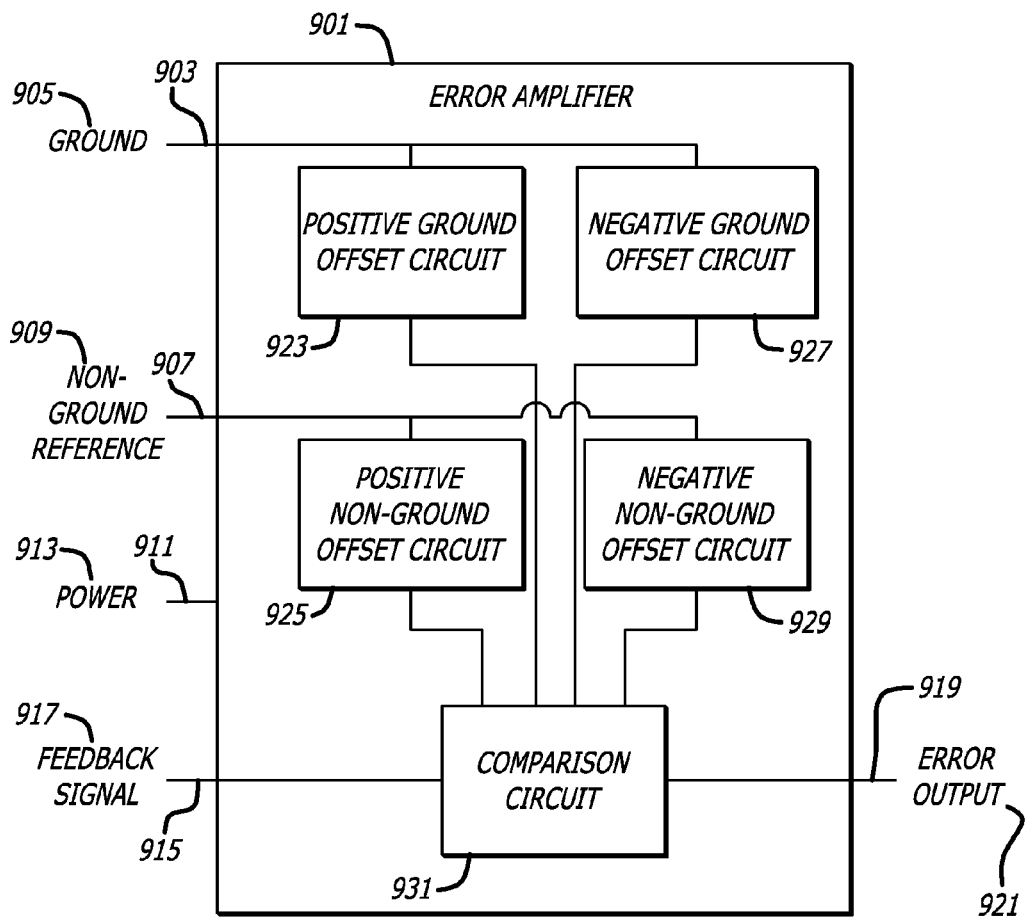
FIG. 9 is an example of an error amplifier which may be used with a voltage regulator to provide either a positive or negative output voltage based on either a positive or negative voltage input.

FIG. 9 is an example of an error amplifier 901 which may be used with a voltage regulator to provide either a positive or negative output voltage based on either a positive or negative voltage input. As illustrated in FIG. 9, the error amplifier 901 may include a ground input 903, a non-ground reference input 907, a power input 911, and a feedback signal input 915. The ground input may be configured to receive a ground 905 for the error amplifier 901. The non-ground reference input 907 may be configured to receive a non-ground reference 909 for the error amplifier 901. The power input 911 may be configured to receive power 913 for powering the error amplifier 901. The feedback signal input 915 may be configured to receive a feedback signal 917.

The error amplifier 901 may include an error output 919. The error output 919 may be configured to provide an error output signal 921 indicative of error in the feedback signal 917.

The error amplifier 901 may include positive ground, positive non-ground, negative ground, and negative non-ground offset circuit 923, 925, 927, and 929, respectively. The positive ground offset circuit 923 may be configured to provide a reference signal by providing an offset from the ground reference 905 by a constant positive amount. The positive non-ground offset circuit 925 may be configured to provide another reference signal by providing an offset from the non-ground reference 909 by a constant positive amount. The negative ground offset circuit 927 may be configured to provide another reference signal by providing an offset from the ground reference 905 by a constant negative amount. The negative non-ground offset circuit 929 may be configured to provide another reference signal by providing an offset from the non-ground reference 909 by a constant negative amount.

The error amplifier may include a comparison circuit 931. The comparison circuit 931 may be configured to provide an error signal to the error output 919 which is indicative of a difference between the feedback signal and the reference signal which is closest to the error signal. Thus, for example, when the feedback signal is closest to the positive ground reference signal, the error signal may be indicative of the difference between the feedback signal and the reference signal produced by the positive ground offset circuit 923. When the feedback signal is closest to the positive non-ground reference signal, the error signal may be indicative of the difference between the feedback signal and the reference signal produced by the positive non-ground offset circuit 925.

When the feedback signal is closest to the negative ground reference signal, the error signal may be indicative of the difference between the feedback signal and the reference signal produced by the negative ground offset circuit 927. When the error signal is closest to the negative non-ground reference signal, the error signal may be indicative of the difference between the feedback signal and the reference signal produced by the negative non-ground offset circuit 929.

Although four reference signals have been described, the error amplifier 901 may instead use only two reference signals. One may be representative of an offset from the ground 905 by a constant amount, while the other may be representative of an offset from the non-ground reference 909 by a constant amount. In this configuration, the comparison circuit 931 may still be configured to provide an error signal which is indicative of the difference between the feedback signal and the reference signal which is closest to the feedback signal.

The error amplifier 901 may be instead configured to provide a different number of reference signals, such as three or five different reference signals. In this case, the comparison circuit 931 may still be configured to provide an error signal which is indicative of the difference between the feedback signal and the reference signal which is closest to the feedback signal.

The difference which is indicated by the error signal may be a difference between the voltage of the feedback signal and the voltage of the reference signal which is closest to the feedback signal.

The magnitudes of the constant amounts by which the reference signals are offset may be the same or may be different.

The comparison circuit 931 may be configured to provide the error signal as described above without receiving a mode signal from a mode input which indicates to the comparison circuit which reference signal should be compared to the feedback signal.

The comparison circuit 931 may be configured to cause the error signal to increase when the difference between the feedback signal and any of the reference signals having an offset of one polarity increase. Conversely, the comparison circuit 931 may be configured to cause the error signal to decrease when the difference between the feedback signal and any of the reference signals having an offset of the other polarity decreases.

The error amplifier 901 may be made of discrete components or may be in whole or in part contained on a single integrated circuit. A driver circuit, such as a driver circuit of the types referenced in connection with FIG. 1, 3, 7, or 8, may be included on the integrated circuit.

The power input 911 and the non-ground reference input 907 may instead be a single input. In this case, the power 913 may additionally function as the non-ground reference 909. In other configurations, the power input 911 and the non-ground reference input 907 may be separate, as illustrated in FIG. 9.

The net effect of the configuration of the error amplifier 901 illustrated in FIG. 9 may be to allow the single feedback signal input 915 to be used to sense an output voltage in a voltage regulator configured in any one of at least four different topologies. The four topologies may be those which generate outputs which are (1) positive or (2) negative with respect to the integrated circuit's ground reference input 903 and (3) positive or (4) negative with respect to the integrated circuit's non-ground reference input 907 (or with respect to the integrated circuit's power input 911 when the power input and non-ground input are consolidated, as described above). In other words, the configuration illustrated in FIG. 9 may detect and regulate output voltages in any of these four configurations by using only a single feedback signal input 915. The error amplifier 901 illustrated in FIG. 9 thus facilitates an integrated circuit design which can support any of the aforementioned four topologies with only a single feedback input pin, without any corresponding mode selection input. As explained above in the description of related art, prior art sensing circuits have traditionally required more pins and, in certain configurations, have resulted in performance tradeoffs.

Figure 10:
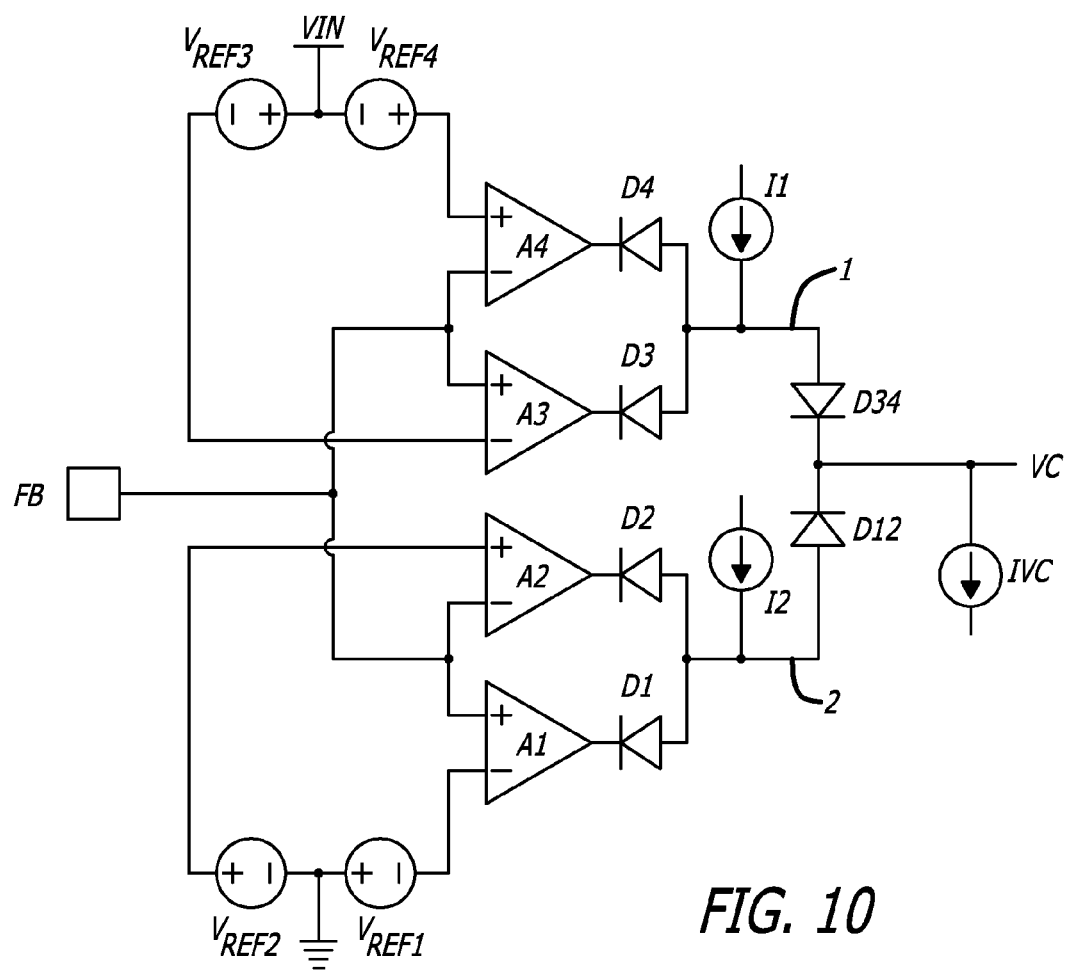
FIG. 10 is an example of the error amplifier illustrated in FIG. 9.

FIG. 10 is an example of the error amplifier illustrated in FIG. 9. The current sources I1 and I2 may each be configured to source more current than the current source IVC. A1-A4 may each be high-gain differential amplifiers. The four voltage references $V_{REF1}$-$V_{REF4}$ may each be part of one of the offset circuits illustrated in FIG. 9. The supply voltage input $V_{IN}$ may serve to receive both the power 913 and the non-ground reference 909 illustrated in FIG. 9. FB may be the feedback signal input 915 illustrated in FIG. 9. The error output VC may be the error output 919 illustrated in FIG. 9.

Figure 11:
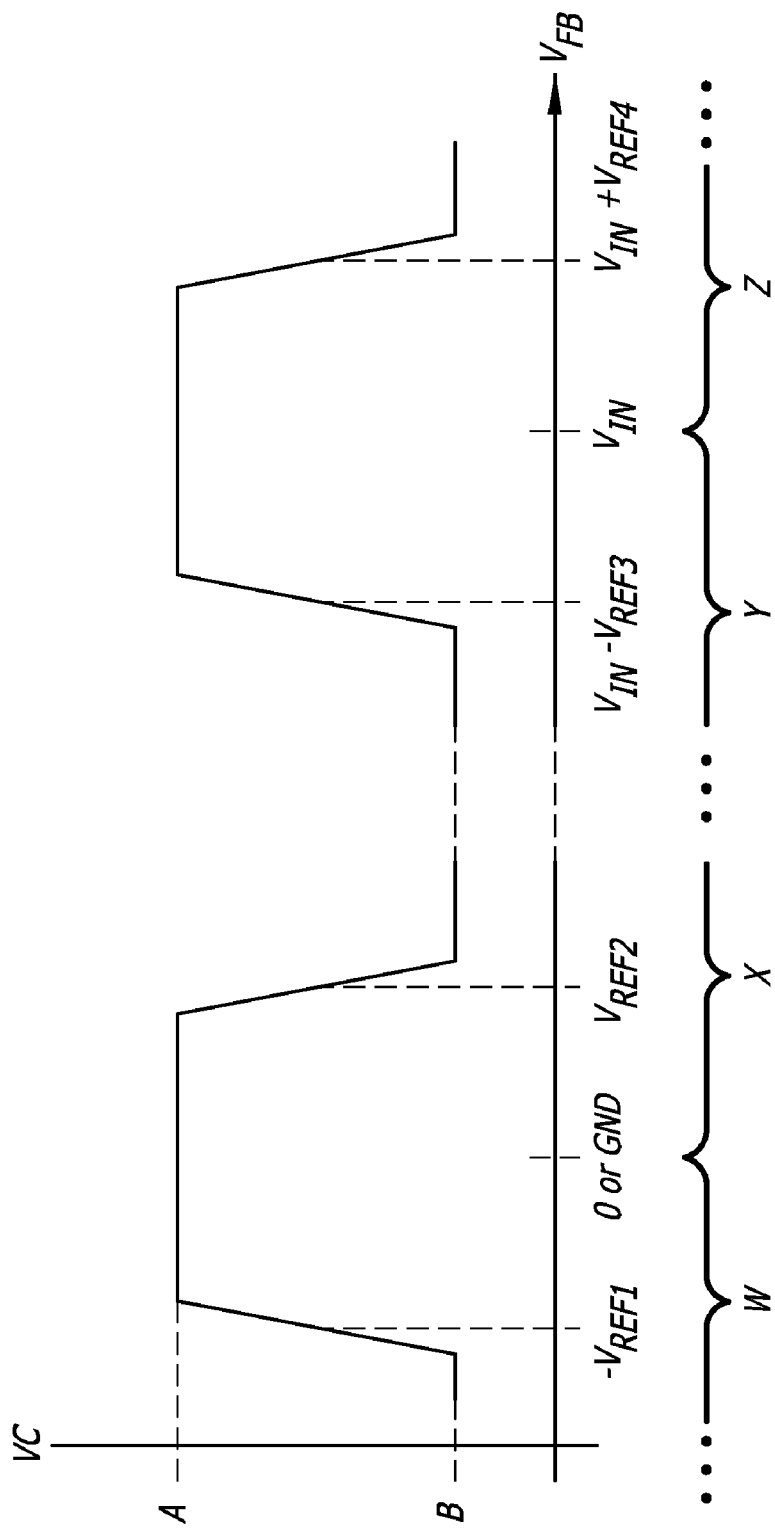
FIG. 11 is an example of a transfer function of the error amplifier illustrated in FIG. 10.

FIG. 11 is an example of a transfer function of the error amplifier illustrated in FIG. 10. The four reference voltages $V_{REF1}$-$V_{REF4}$ which are illustrated in FIG. 10 may contribute to the transfer function illustrated in FIG. 11. Depending upon the topology of the voltage regulator in which the error amplifier of FIG. 10 is used, the feedback signal FB may be closest to the offset voltage generated by one of these reference voltages. This offset voltage will then serve as the basis for the error output VC. The differential amplifier which is associated with this offset voltage (A1, A2, A3, or A4) may be active and thus perform the voltage subtraction which controls the error output VC, while the remaining three amplifiers may have no effect on the error output VC. When the feedback signal FB is not close to any of the reference signals, the output of all four error amplifies may saturate. The range of feedback signals which produce saturated outputs may vary depending upon the design from substantial to zero.

This functionality may be illustrated by a specific example. Assume that $V_{REF1}$-$V_{REF4}$ are each 0.800V, VIN=10V and FB=0.79V. Amplifier A3 may generate a low output voltage, pulling down node 1 and reverse biasing diode D34. Therefore amplifiers A3 and A4 may no longer contribute to the error output VC. Also, the outputs of A1 & A2 may be driven high, reverse biasing diodes D1 & D2. This may allow the current I2 (which may be greater than IVC) to pull up on node 2, resulting in a high VC voltage level (level A on FIG. 10). As the voltage on FB rises and eventually becomes greater than 0.8V, the output of A2 may fall to a low voltage level. This may forward bias D2, pulling node 2 low and allowing the IVC current to pull VC to a low level (B on FIG. 10). In short, as the FB voltage moves slightly above and below $V_{REF2}$, amplifier A2 may cause the error output VC to rise and fall in proportion to this difference. Meanwhile, the outputs of the remaining three amplifiers A1, A3 & A4 may have no effect on the error output VC. In other configurations, the FB voltage may be closer to one of the other offset references ($-V_{REF1}$, $V_{IN}-V_{REF3}$ or $V_{IN}+V_{REF4}$), in which case the amplifier associated with this closest offset reference may control the error output VC in a comparable manner.

The following table illustrates which reference may control the error output VC as a function of the voltage regulator topology.

| When Output is... | With respect to the integrated circuit's... | Primary Reference is... | Due to design of regulator topology, region that FB voltage may be confined to (see FIG. 11) is... |
|---|---|---|---|
| Negative | Ground | $V_{REF1}$ | W |
| Positive | Ground | $V_{REF2}$ | X |
| Negative | $V_{IN}$ | $V_{REF3}$ | Y |
| Positive | $V_{IN}$ | $V_{REF4}$ | Z |

Figure 1:
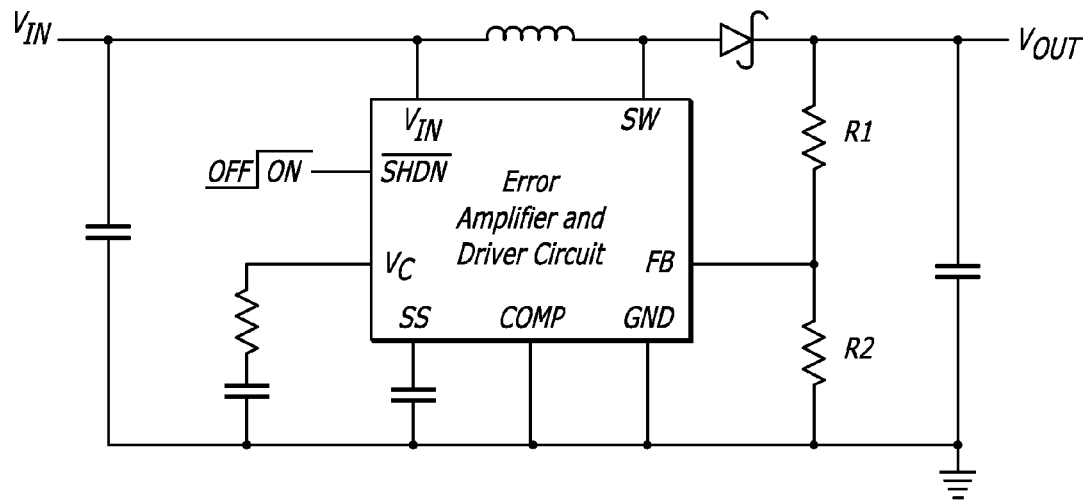
FIG. 1 is an example of a prior art voltage regulator which provides a positive output voltage based on a positive input voltage and which uses a combined error amplifier and driver circuit on a single integrated circuit.
Figure 2:
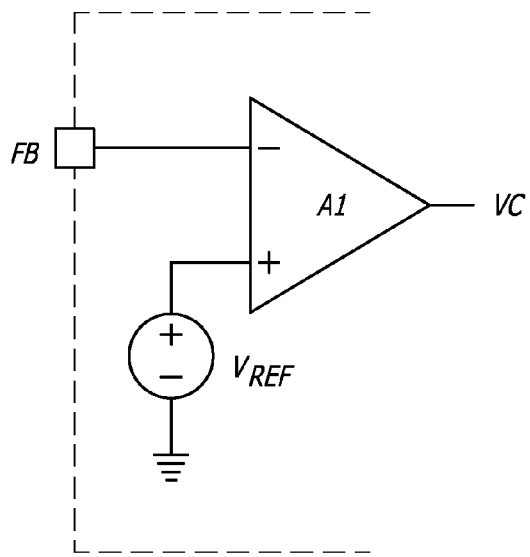
FIG. 2 is an example of a prior art comparison circuit which may be used in the combined error amplifier and driver circuit illustrated in FIG. 1.
Figure 3:
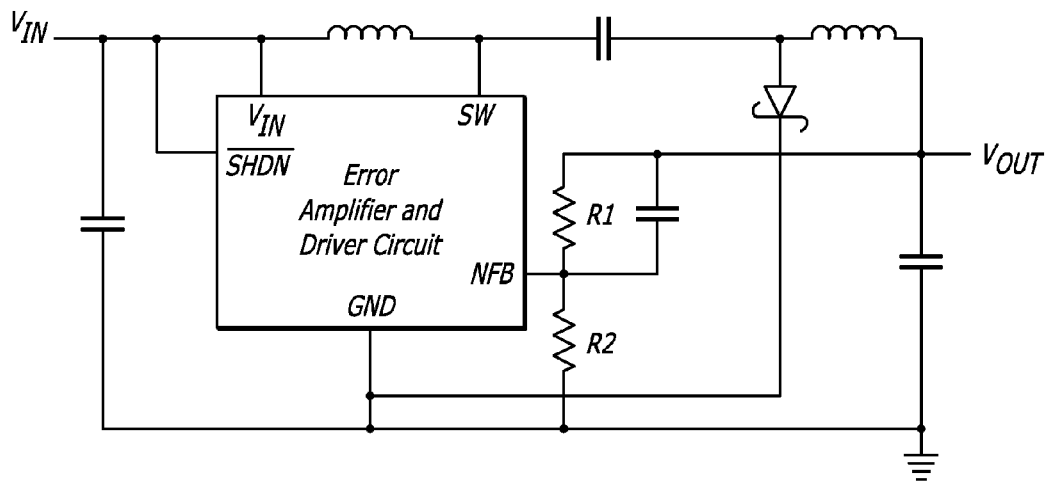
FIG. 3 is an example of a prior art voltage regulator which provides a negative output voltage based on a positive input voltage and which uses a combined error amplifier and driver circuit on a single integrated circuit.
Figure 4:
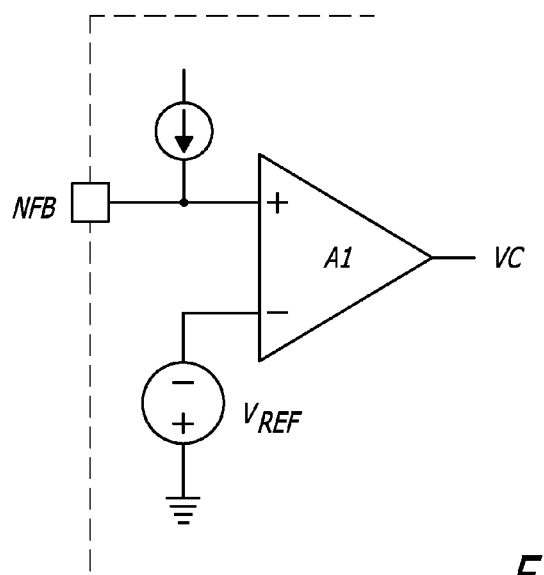
FIG. 4 is an example of a prior art comparison circuit which may be used in the combined error amplifier and driver circuit illustrated in FIG. 3.
Figure 5B:
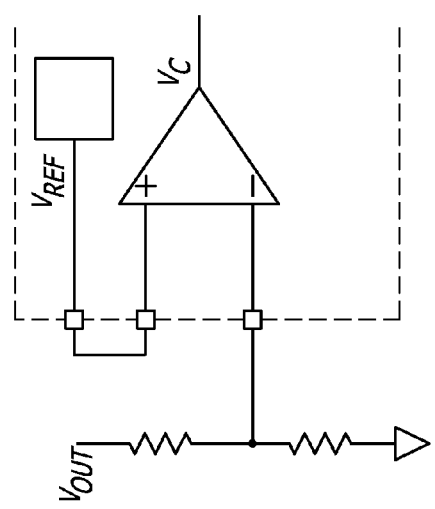
FIG. 5B illustrates the circuit configured to sense positive output voltage.
Figure 5C:
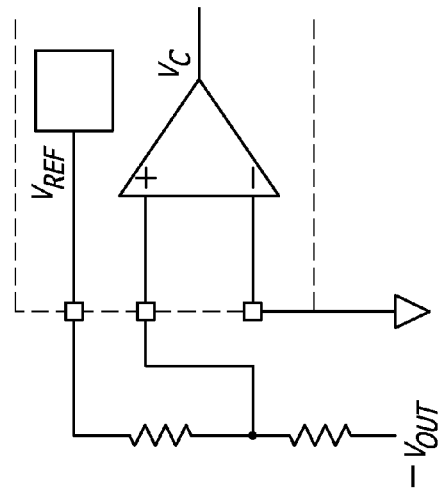
FIG. 5C illustrates the circuit configured to sense negative output voltage.
Figure 5A:
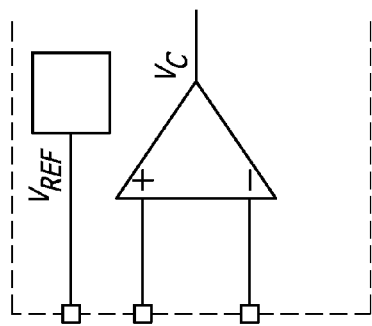
FIG. 5A is an example of a prior art comparison circuit which may be used in an error amplifier in a voltage regulator which may provide either a positive or negative output based on a positive input.
Figure 6B:
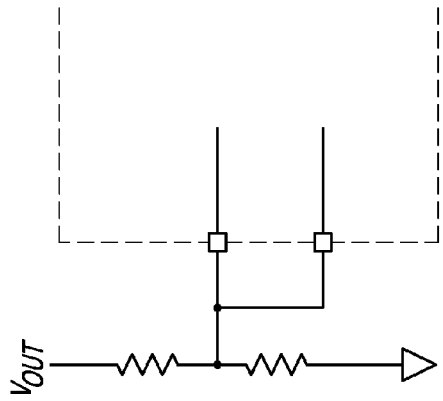
FIG. 6B illustrates this circuit configured to sense positive output voltages.
Figure 6C:
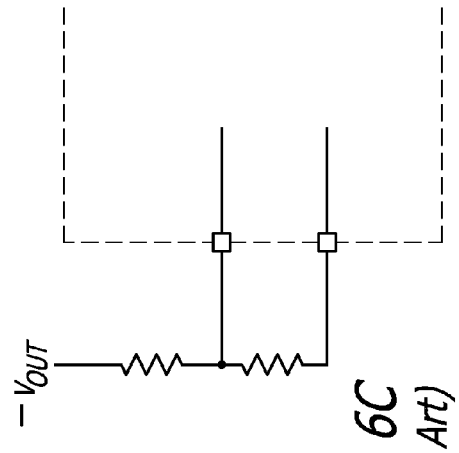
FIG. 6C illustrates this circuit configured to sense negative output voltages.
Figure 6A:
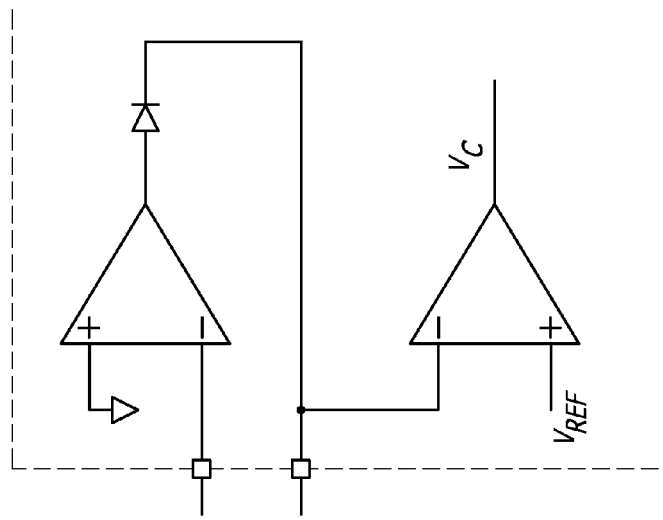
FIG. 6A is another example of a prior art comparison circuit which may be used in an error amplifier in a voltage regulator which may provide either a positive or negative output based on a positive input.
Figure 7:
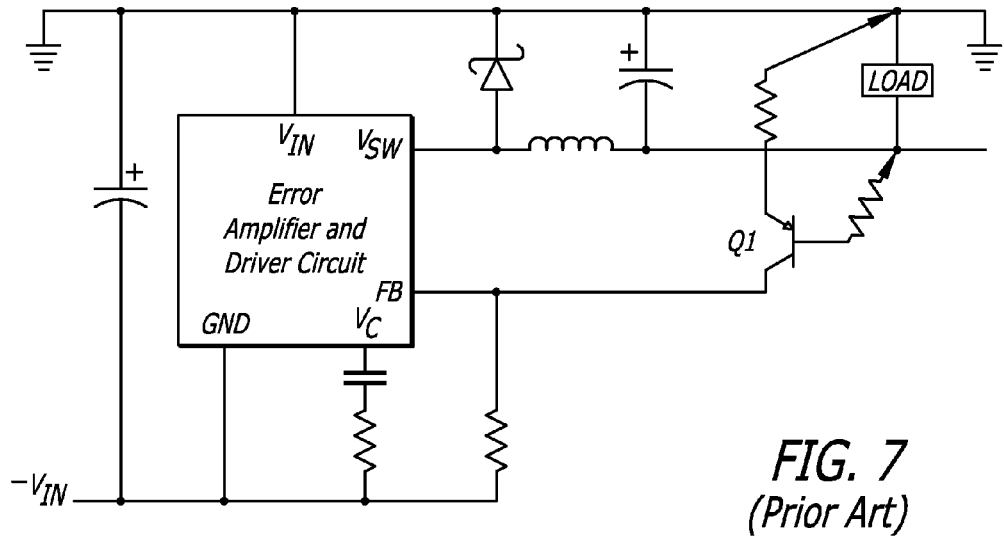
FIG. 7 is an example of a prior art voltage regulator which provides a negative output voltage based on a negative input voltage and which uses a combined error amplifier and driver circuit on a single integrated circuit.
Figure 8:
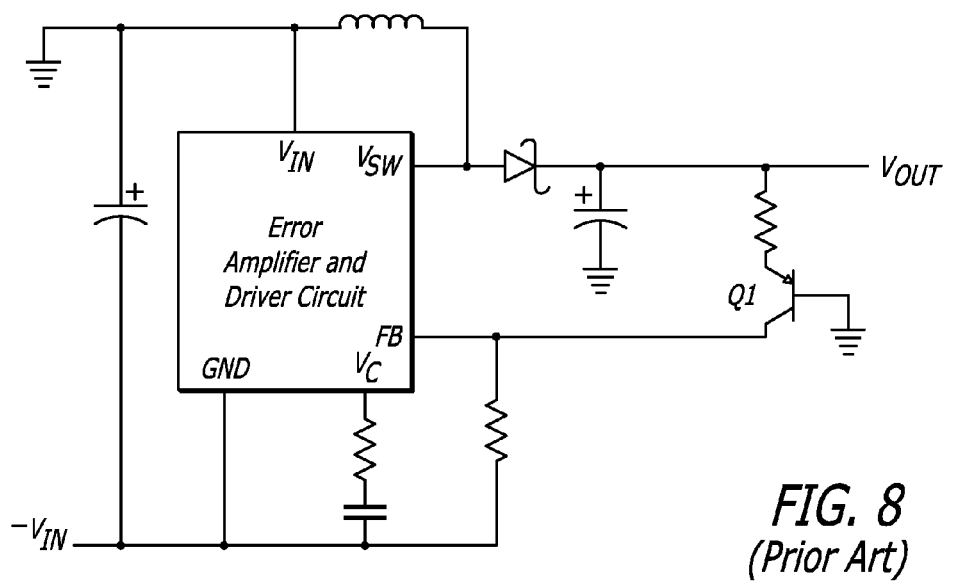
FIG. 8 is an example of a prior art voltage regulator which provides a positive output voltage based on a negative input voltage and which uses a combined error amplifier and driver circuit on a single integrated circuit.

As an example, the error amplifier illustrated in FIG. 10 may be used to replace the configuration in FIGS. 1 & 2. In this case, $V_{REF2}$ may become the primary reference. To understand why this may happen, note that, in the regulator of FIG. 1, $V_{OUT}$ may be a voltage which is always positive with respect to ground. Also, the resistor divider from $V_{OUT}$ to FB may be configured such that FB=$V_{REF2}$ when $V_{OUT}$ equals the desired output voltage. Therefore, by design, the FB voltage for the regulator of FIG. 1 may be confined to region "X" as shown in FIG. 10. Since higher VC voltages may cause $V_{OUT}$ to rise and lower VC voltages may cause $V_{OUT}$ to fall, $V_{OUT}$ may regulate to a voltage which causes FB to be very close to $V_{REF2}$.

Figure 12A:
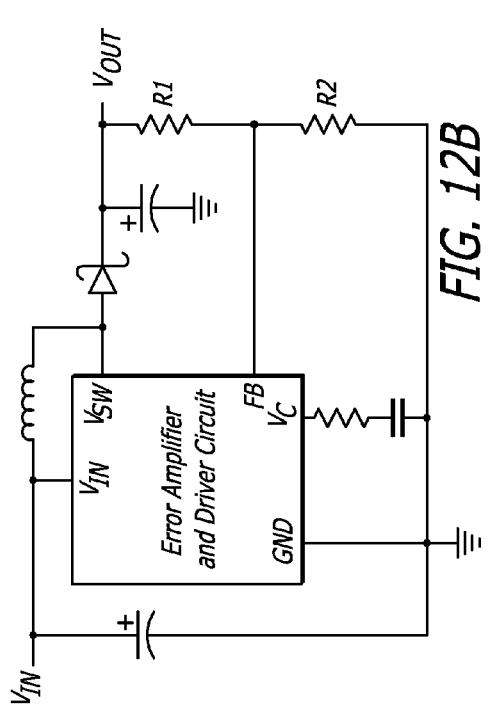
FIGS. 12A-12D are examples of voltage regulators which may use the error amplifier illustrated in FIG. 10 in an integrated circuit combined with a driver circuit.

FIG. 12A is an example of a voltage regulator which provides a positive output voltage based on a negative input voltage and which may use the error amplifier illustrated in FIG. 10 in an integrated circuit combined with a driver circuit. FIG. 12A shows what the resulting application circuit may look like. FIG. 12A may provide the same regulation as in FIG. 8, but without Q1, thus eliminating the output voltage inaccuracy which Q1 may cause, as described above in connection with FIG. 8. The feedback signal FB may operate in region "Z" as shown in FIG. 11 with $V_{REF4}$ serving as the primary reference.

Figure 12B:
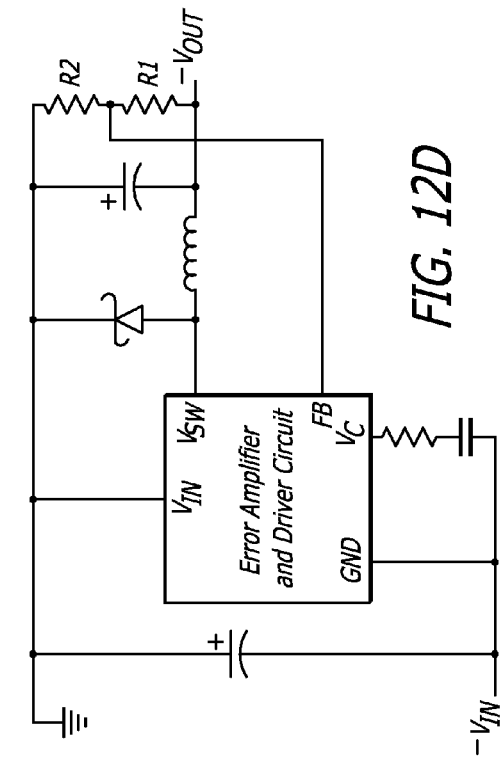

FIG. 12B is an example of a voltage regulator which provides a positive output voltage based on a positive input voltage and which may use the error amplifier illustrated in FIG. 10 in an integrated circuit combined with the driver circuit.

Figure 12C:
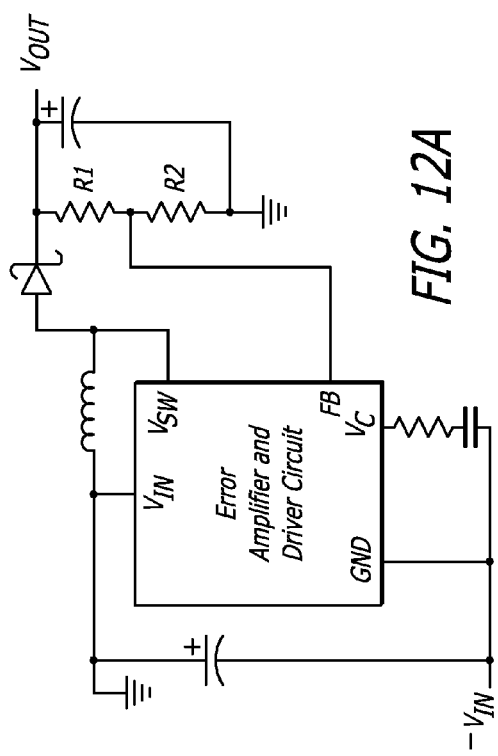

FIG. 12C is an example of a voltage regulator which provides a negative output voltage based on a positive input voltage and which may use the error amplifier illustrated in FIG. 10 in an integrated circuit combined with the driver circuit.

Figure 12D:
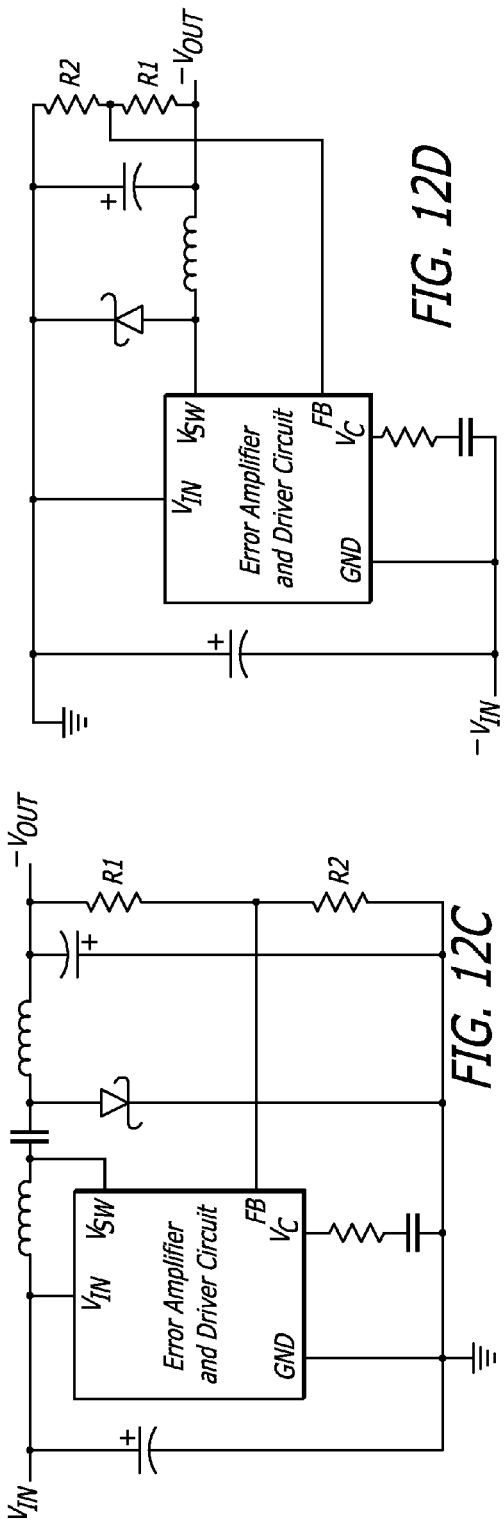

FIG. 12D is an example of a voltage regulator which provides a negative output voltage based on a negative input voltage and which may use the error amplifier illustrated in FIG. 10 in an integrated circuit combined with the driver circuit.

Figures 1, 13:
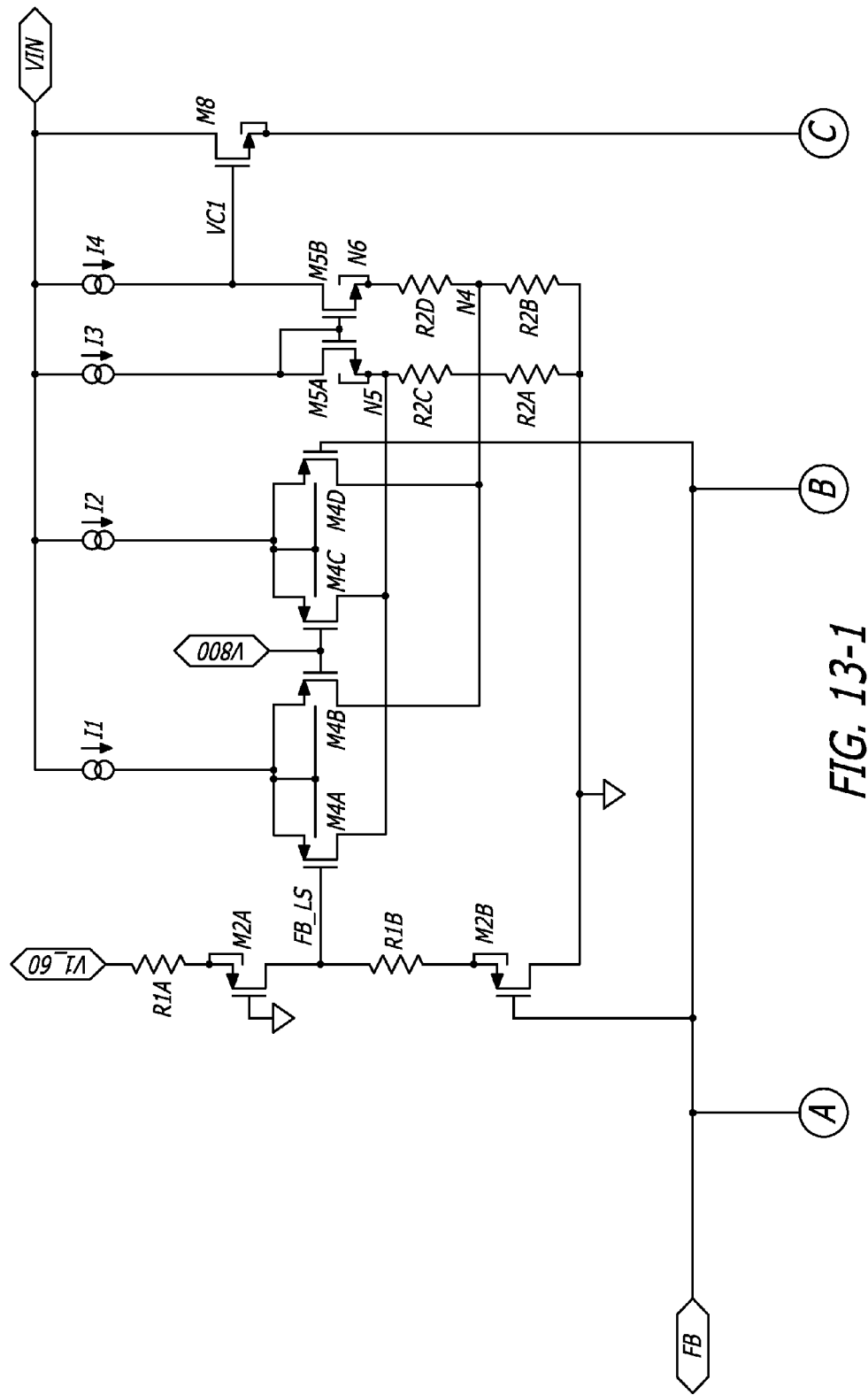
FIG. 13 is a schematic of an example of the error amplifier illustrated in FIG. 10.
Figures 2, 13:
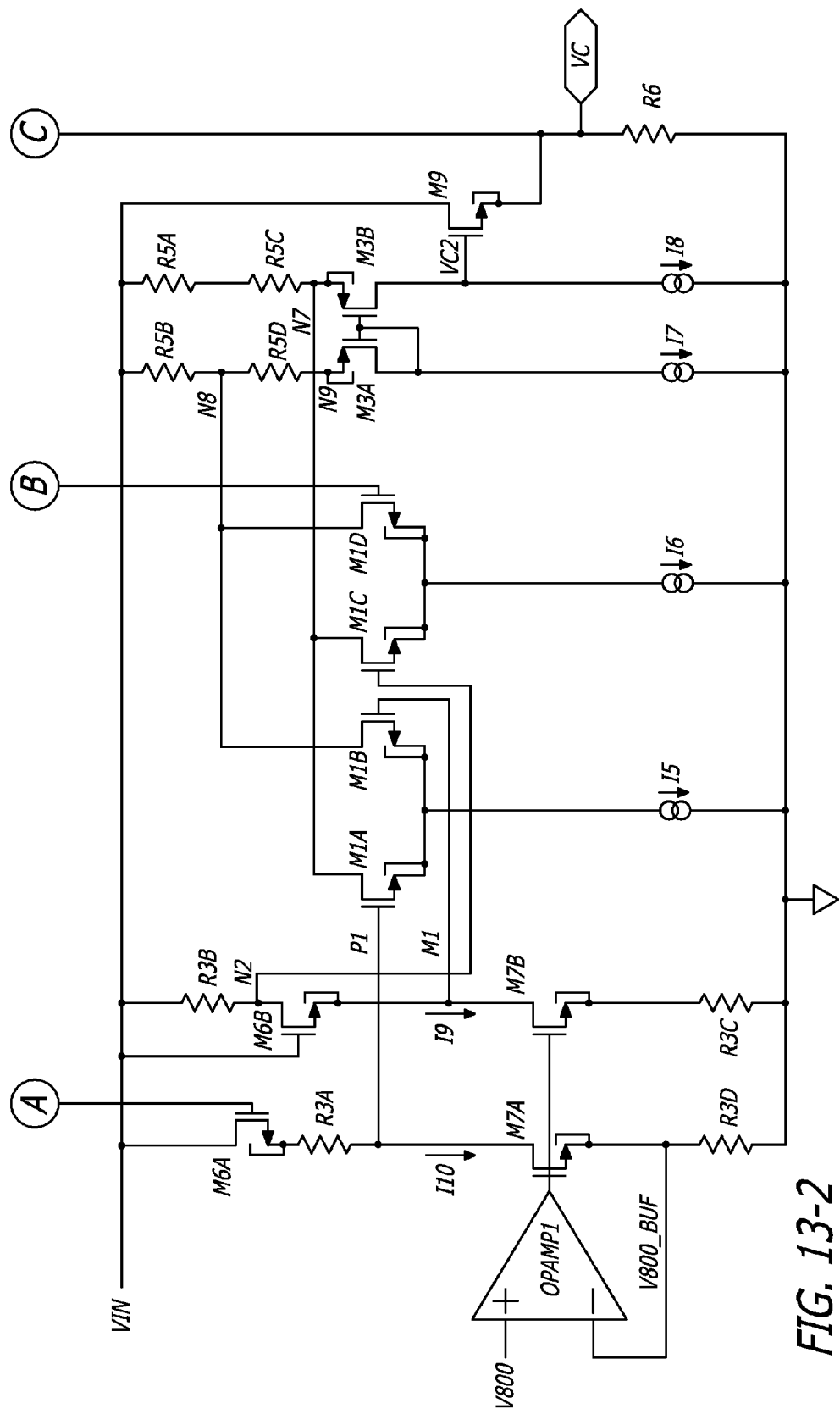

FIG. 13 is a schematic of an example of the error amplifier illustrated in FIG. 10. The upper half of the schematic (FIG. 13-1) may perform the functions of A1, A2, D1, D2, D12 and I2 shown in FIG. 10. The lower half of the schematic (FIG. 13-2) may perform the functions of A3, A4, D3, D4, I1 and IVC from FIG. 10. In this example, $V_{REF1}$-$V_{REF4}$ may each be 800 mV. The error amplifier may be adapted to provide almost any desired output voltage by adjusting the ratio of the resistors which are used to generate the feedback FB signal which is provided to it, such as the ratio of R1 to R2 shown in FIG. 3.

An 800 mV reference voltage circuit (not shown) may be used to drive the V800 node. A 1.600V voltage supply (not shown) may similarly drive the V1_60 node. Implementations for these circuits are commonly known.

Implementing Regions W and X of the Transfer Function

Devices M4A-D, M5A-B, R2A-D and I1-I4 may perform a similar function to A1, A2, D1, D2 and I2 in FIG. 9. M4A & M4B may comprise a matched differential pair used to steer current I1 to either N4 or N5. They may help perform the function of A1 in FIG. 10 with the gate of M4A being the positive input and the gate of M4B being the negative input. M4C & M4D may comprise a matched differential pair used to steer current I2 to either N4 or N5. They may help perform the function of A2 in FIG. 10 with the gate of M4C being the positive input and the gate of M4D being the negative input.

Example of Negative Output with Respect to Chip Ground

Assume I1-I4 are all equal. Also assume R2C=R2D and R2A=R2B=½R2C.

When the regulator is configured for a negative output with respect to ground, FB may be in region "W." In this case, M4D may steer all of I2 into N4. When FB is equal to −0.800V then FB_LS may be equal to 0.800V (see level shifter description below in section entitled FB_LS Level Shifter). In this case ½ of I1 may be steered through M4B into node N4 and the other ½ of I1 may be steered through M4A into node N5. By using superposition, it may be seen that $V_{N5}$ may equal $V_{N6}$ and VC1 may be at a "middle" voltage.

As FB increases above −0.800V, FB_LS also may increase. This may lead to more than ½ of I1 being steered through M4B into N4 and less than ½ of I1 being steered through M4A into N5. Again, using superposition it may be seen that $V_{N6}$>$V_{N5}$ and the VC1 voltage may increase. Conversely, as FB decreases below −0.800V, FB_LS may also decrease. Current steering may happen in the opposite direction of that described above leading to a decrease in VC1 voltage.

Example of Positive Output with Respect to Chip Ground

When the regulator is configured for a positive output with respect to ground, FB may be in region "X." In this case, FB_LS may be much greater than 800 mV and M4B may steer all of I1 into N4. If FB is equal to 0.800V then ½ of I2 may be steered through M4C into node N5 and the other ½ of I2 may be steered through M4D into node N4. By using superposition it may be seen that $V_{N5}$ may equal $V_{N6}$ and VC1 may be at a "middle" voltage.

Increasing FB above 0.800V may lead to more than ½ of I2 being steered through M4C into N5 and less than ½ of I2 being steered through M4D into N4. Again, using superposition it may be seen that $V_{N5}$ may be greater than $V_{N6}$ and the VC1 voltage may decrease. Conversely, as FB decreases below 0.800V, current steering may happen in the opposite direction of that described above leading to an increase in VC1 voltage.

Implementing Regions Y and Z of the Transfer Function

Assume I5-I8 equal each other. Also assume R5C=R5D and R5A=R5B=½R5C. Also assume R3A-R3D all equal each other.

Devices M1A-D, M3A-B, R5A-D and I5-I8 may perform a similar function to A3, A4, D3, D4 and I1 in FIG. 10. M1A & M1B may comprise a matched differential pair used to steer current I5 from either N7 or N8. They may help perform the function of A4 in FIG. 10 with the gate of M1A being the negative input and the gate of M1B being the positive input. M1C & M1D may comprise a matched differential pair used to steer current I6 from either N7 or N8. They may help perform the function of A3 in FIG. 10 with the gate of M1C being the negative input and the gate of M1D being the positive input.

Example of Negative Output with Respect to Chip $V_{IN}$

When the regulator is configured for a negative output with respect to VIN, FB may be in region "Y". In this case M1B may steer all of I5 from N8. This can be better understood after reading section Additional References & Level Shifting which describes what the M1 & P1 voltages are. The Additional References & Level Shifting section also discusses the fact that the N2 node voltage is $V_{IN}$–0.800V. Now, it may be seen that if FB is equal to $V_{IN}$–0.800V then ½ of I6 may be steered through M1C from node N7 and the other ½ of I6 may be steered through M1D from node N8. By using superposition it may be seen that $V_{N9}$ may equal $V_{N7}$ and VC2 will be at a "middle" voltage.

Increasing FB above $V_{IN}$–0.800V may cause more than ½ of I6 to be steered through M1D from N8 and less than ½ of I6 to be steered through M1C from N7. Again, using superposition it may be seen that $V_{N7}$ may be greater than $V_{N9}$ and the VC2 voltage may increase. Conversely, as FB decreases below $V_{IN}$–0.800V current steering may happen in the opposite direction of that described above and may lead to a decrease in the VC2 voltage.

Example of Positive Output with Respect to Chip $V_{IN}$

When the regulator is configured for a positive output with respect to $V_{IN}$, FB may be in region "Z". In this case M1D may steer all of I6 from N8. When FB is equal to $V_{IN}$+0.800V then P1 may equal M1 and ½ of I5 may be steered through M1A from node N7 and the other ½ of I5 may be steered through M1B from node N8. By using superposition it may be seen that $V_{N9}$ may equal $V_{N7}$ and VC2 may be at a "middle" voltage.

Increasing FB above $V_{IN}$+0.800V may increase P1 leading to more than ½ of I5 being steered through M1A from N7 and less than ½ of I5 being steered through M1B from N8. Again, using superposition it may be seen that $V_{N9}$ may be greater than $V_{N7}$ and the VC2 voltage may decrease. Conversely, as FB decreases below VIN+0.800V, current steering may happen in the opposite direction of that described above leading to an increase in the VC2 voltage.

Figure 14:
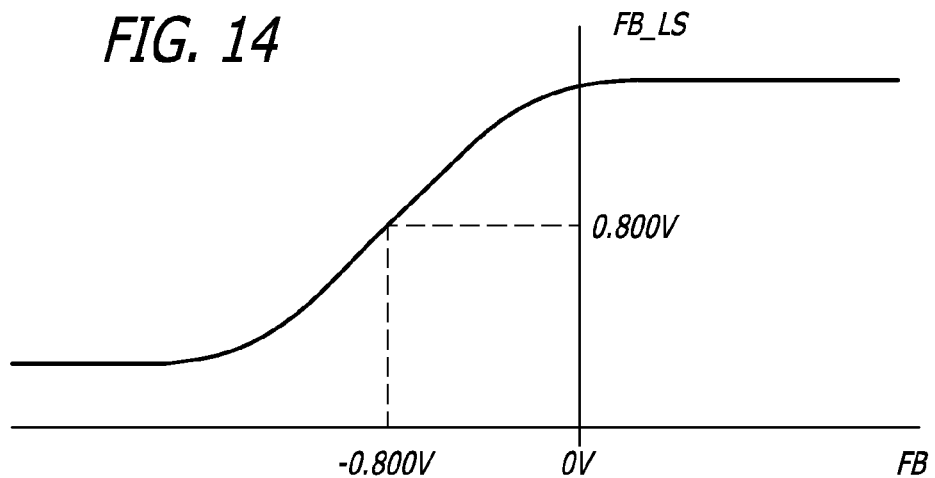
FIG. 14 is an example of a transfer function for the level shifter which is contained within the schematic illustrated in FIG. 13.

FIG. 14 is an example of a transfer function for the level shifter which is contained within the schematic illustrated in FIG. 13-1. As illustrated in FIG. 14, devices R1A-B and M2A-B may comprise a voltage level shifter circuit with the transfer function as shown in FIG. 14.

R1A may match R1B and M2A may match M2B for this circuit to function properly. The level shifter may be used to help implement the function of amplifier A1 and $V_{REF1}$ in FIG. 10. As shown in FIG. 13, –800 mV on FB may be shifted up to +800 mV on FB_LS. FB_LS may then be compared to +800 mV using the differential pair M4A-B. Therefore the combined circuit may be effectively comparing FB to –800 mV (–$V_{REF1}$) which may be the desired function. A more detailed description of this level shifting circuit may be found in U.S. patent application Ser. No. 11/717,647, the entire content of which is incorporated herein by reference.

Additional References & Level Shifting

Devices M6A-B, R3A-D, M7A-B and OPAMP1 may be used to create the appropriate input signals for M1A-C. OPAMP1 and M7A may be connected in a feedback loop which may force the V800_BUF voltage to be equal to 800 mV. This may cause current I10 to be $$\frac{0.800}{R3D}$$

which may be 5 μA in this case. Since M7B and R3C may be identical to M7A and R3D respectively, I9 may be the same as I10 to be $$\left(\frac{0.800}{R3D} \text{ or } 5\mu A\right).$$

Since I9=I10 and R3A-D may be all identical, the voltage drop across any of R3A-D may equal 800 mV.

N2 may equal $V_{IN}$–0.800V. Therefore, N2 may become the negative voltage reference in $V_{IN}$–$V_{REF3}$ as shown in FIG. 10. Differential pair M1C-3 may therefore compare $V_{IN}$–$V_{REF3}$ to FB helping to implement the function of A3 and $V_{REF3}$ in FIG. 10.

Figure 15:
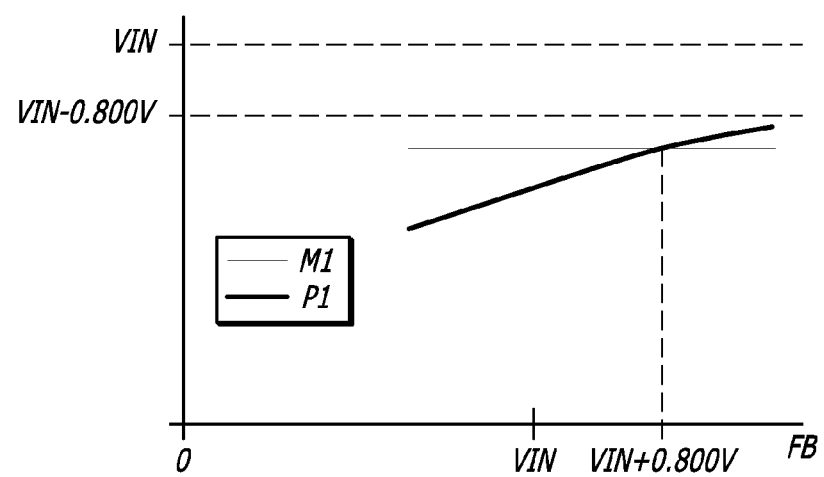
FIG. 15 illustrates examples of signals which may be found in the schematic illustrated in FIG. 13.

FIG. 15 illustrates examples of signals which may be found in the schematic illustrated in FIG. 13. Devices M6A, M6B and R3A may be included to create the M1 and P1 signals. These signals may be required to implement the function of A4 and $V_{REF4}$ in FIG. 10. The devices may be configured such that M1 may equal P1 when FB=$V_{IN}$+$V_{REF4}$. As a result the differential pair, M1A-B may be effectively comparing FB to $V_{IN}$+$V_{REF4}$ which, again, may be the function of A4 and $V_{REF4}$ in FIG. 10.

M6B may be connected such that it operates in its linear region (as a resistor). M1 may be a constant voltage equal to $V_{IN}$–0.800–$V_{DS(M6B)}$. Under these conditions, $V_{P1}$ may be equal to $V_{M1}$ when:

$$V_{P1}+(I10 \cdot R3A)+V_{DS(M6A)}=V_{M1}+V_{DS(M6B)}+(I9 \cdot R3B)$$

Since $V_{P1}$=$V_{M1}$, I10=O9 and R3A=R3B the above result may be rearranged to yield:

$$V_{DS(M6A)}=V_{DS(M6B)}$$

Since M6A and M6B are identical devices with identical drain currents, $V_{DS(M6A)}$ may equate to $V_{DS(M6B)}$ when $V_{GS(M6A)}$=$V_{GS(M6B)}$. Solving for the $V_{GS}$ voltages:

$$V_{GS(M6A)}=FB-(V_{P1}+0.800)$$

$$V_{GS(M6B)}=V_{IN}-V_{M1}$$

Equating $V_{GS(M6A)}$ and $V_{GS(M6B)}$ and noting again that $V_{P1}$=$V_{M1}$ yields:

$$FB=V_{IN}+0.800$$

Or $$FB=V_{IN}+(V_{REF4})$$

Restated, $V_{M1}$=$V_{P1}$ when FB=$V_{IN}$+$V_{REF4}$.

Remaining Circuitry

It may be seen that M8 and M9 may perform the functions of D12 and D34 in FIG. 10, respectively. Resistor R6 may perform the function of IVC in FIG. 10.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

For example, alternative ways to implement the circuit of FIG. 13 may include using Bipolar transistors instead of MOSFETs, diodes instead of MOSFETs, and, in some cases, using resistors instead of current sources. Also, four individual comparators can be built instead of using the superposition techniques shown. The $V_{REF1-4}$ voltages may instead be referenced to signals other than ground or $V_{IN}$. Fewer or more reference levels may also be used, such as two, three or five.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

Nothing which has been stated or illustrated is intended or should be interpreted to cause a dedication of any component, step, feature, object, benefit, advantage, or equivalent to the public, regardless of whether it is recited in the claims.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

The invention claimed is:

1. An error amplifier having a common ground node comprising:
   a single feedback input configured to receive a feedback signal;
   a single error output configured to provide an error output signal indicative of error in the feedback signal; and
   a comparison circuit configured to provide an error signal to the single error output which is indicative of a difference between the feedback signal and whichever one of multiple different reference signals is closest to the feedback signal, wherein one of the multiple reference signals is referenced to the common ground node and another of the multiple reference signals is referenced to a potential that is not at the level of the common ground node.

2. The error amplifier of claim 1 further comprising:
   a ground input configured to receive a ground reference for the error amplifier;
   a non-ground reference input configured to receive a non-ground reference for the error amplifier;
   a ground offset circuit configured to provide one of the reference signals by providing an offset from the ground reference by a constant amount; and
   a non-ground offset circuit configured to provide another of the reference signals by providing an offset from the non-ground reference by a constant amount.

3. The error amplifier of claim 2 wherein the two constant amounts have the same magnitude.

4. The error amplifier of claim 2 wherein the two constant amounts have different magnitudes.

5. The error amplifier of claim 1 further comprising a power input configured to receive power for powering the error amplifier, and wherein the power input and the non-ground reference input are the same input.

6. The error amplifier of claim 1 further comprising a power input configured to receive power for powering the error amplifier, and wherein the power input and the non-ground reference input are different inputs.

7. The error amplifier of claim 1 wherein the error amplifier is contained on a single integrated circuit.

8. The error amplifier of claim 1 wherein the difference is a differences between the voltage of the feedback signal and the voltage of the closest reference signal.

9. The error amplifier of claim 1 wherein the comparison circuit does not have a mode input configured to receive a mode signal which indicates to the comparison circuit which reference signal should be compared to the feedback signal.

10. The error amplifier of claim 1 wherein the comparison circuit is configured to cause the error signal to:
    increase when the difference between the feedback signal and one of the reference signals increases; and
    decrease when the difference between the feedback signal and another of the reference signals decreases.

11. An error amplifier comprising:
    a single feedback input configured to receive a feedback signal;
    a single error output configured to provide an error output signal indicative of error in the feedback signal;
    a comparison circuit configured to provide an error signal to the single error output which is indicative of a difference between the feedback signal and whichever one of multiple different reference signals is closest to the feedback signals, wherein the multiple different reference signals includes at least four different reference signals.

12. The error amplifier of claim 11 further comprising:
    a ground input configured to receive a ground reference for the error amplifier;
    a non-ground reference input configured to receive a non-ground reference for the error amplifier;
    a positive ground offset circuit configured to provide one of the reference signals by providing an offset from the ground reference by a constant positive amount; and
    a positive non-ground offset circuit configured to provide another of the reference signals by providing an offset from the non-ground reference by a constant positive amount;
    a negative ground offset circuit configured to provide one of the reference signals by providing an offset from the ground reference by a constant negative amount; and
    a negative non-ground offset circuit configured to provide the fourth reference signal by providing an offset from the non-ground reference by a constant negative amount.

13. The error amplifier of claim 12 wherein the four constant amounts have the same magnitude.

14. The error amplifier of claim 12 wherein the four constant amounts do not have the same magnitude.

15. The error amplifier of claim 12 further comprising a power input configured to receive power for powering the error amplifier, and wherein the power input and the non-ground reference input are the same input.

16. The error amplifier of claim 12 further comprising a power input configured to receive power for powering the error amplifier, and wherein the power input and the non-ground reference input are different inputs.

17. The error amplifier of claim 12 wherein the error amplifier is contained on a single integrated circuit.

18. The error amplifier of claim 12 wherein the difference is the difference between the voltage of the feedback signal and the voltage of the closest reference signal.

19. The error amplifier of claim 12 wherein the comparison circuit does not have a mode input configured to receive a mode signal which indicates to the comparison circuit which reference signal should be compared to the feedback signal.

20. The error amplifier of claim 12 wherein the comparison circuit is configured to cause the error signal to:
   increase when the difference between the feedback signal and any of the reference signals having an offset of one polarity increases; and
   decrease when the difference between the feedback signal and any of the reference signals having an offset of the other polarity decreases.

* * * * *